United States Patent
Reindl

[19]

[11] B 4,009,481
[45] Feb. 22, 1977

[54] METAL SEMICONDUCTOR DIODE

[75] Inventor: Klaus Reindl, Sherman, Tex.

[73] Assignee: Siemens Aktiengesellschaft, Munich and Berlin, Germany

[22] Filed: Aug. 16, 1972

[21] Appl. No.: 281,162

[44] Published under the second Trial Voluntary Protest Program on March 23, 1976 as document No. B 281,162.

Related U.S. Application Data

[63] Continuation of Ser. No. 95,048, Dec. 4, 1970, abandoned.

[30] Foreign Application Priority Data

Dec. 15, 1969 Germany ............... 1962814

[52] U.S. Cl. ........................... 357/15; 357/52; 357/53; 357/54
[51] Int. Cl.² ........................... H01L 29/48
[58] Field of Search .......... 357/15, 52, 53, 54

[56] References Cited

UNITED STATES PATENTS

| 3,388,000 | 6/1968 | Waters | 117/212 |
| 3,405,329 | 10/1968 | Loro | 317/234 |
| 3,476,984 | 11/1969 | Tibol | 317/234 |
| 3,585,496 | 6/1971 | Jager | 317/234 |
| 3,597,667 | 8/1971 | Horn | 317/235 |
| 3,599,054 | 8/1971 | Lepselter | 317/234 |

*Primary Examiner*—William D. Larkins
*Attorney, Agent, or Firm*—Herbert L. Lerner

[57] ABSTRACT

A metal semiconductor diode with a first insulating layer, arranged on a semiconductor body and provided with a first contact window, a second insulating layer, which is thinner than the first insulating layer, has a second contact window which is smaller than the first contact window. The second insulating layer covers the edge of the surface of the semiconductor body which emerges through the first contact window and contact metal is provided in the first and in the second contact window.

2 Claims, 1 Drawing Figure

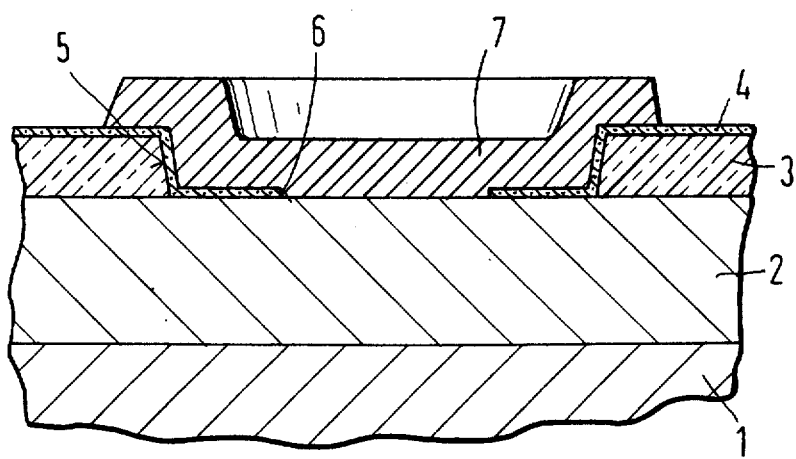

METAL SEMICONDUCTOR DIODE

This is a continuation, of application Ser. No. 95,048, filed Dec. 4, 1970, now abandoned.

The invention relates to a metal semiconductor diode with a first insulating layer arranged on a semiconductor body and provided with a first contact window.

The silicon dioxide layer, used for producing most of the planar structural components, is not ideal in its electrical qualities. For example, in silicon dioxide there occur positive oxide charges, which drift under the influence of electrical fields. Also, the electrical potential is non-homogenous at the edge of the metal semiconductor junction, which results in a high field intensity.

The existence of the charges in the insulating layer and the high edge fields prevent good blocking characteristics of a diode. In order to improve the same, a known diode has a diffused guard ring under the edge zone of the metal semiconductor junction. This increases the breakdown voltage of the diode up to that of the diffused guard ring.

In other diodes, a metal contact which expands across the insulating layer, or a control electrode which is electrically separated from the edge region of the metal semiconductor junction, effect an improvement in the breakdown characteristics. Diodes with two electrode materials are also known, whereof the outer, ring-shaped one, has a higher work function than silicon.

The arrangement of a diffused protective ring under the edge zone requires diffusion. The p-n junction resulting therefrom delivers a blocking current and the switching time is increased through a recombination of the minority load carriers. Furthermore, by providing the insulating layer with the necessary thickness of approximately 0.5 μm, the action of the electrode which extends over this insulating layer is only slight. The placement of a control electrode requires an additional auxiliary voltage and is costly, with respect to its production process. The use of two electrode materials is expensive from the technological standpoint and, as a rule, not conducive to conventional and simple manufacture. In this regard, see ELECTRONICS magazine of July, 1969, pages 74 – 80.

The object of the present invention is to provide a metal semiconductor diode which is simple in its production and has good blocking ability, as well as a high breakdown voltage.

To this end, and in accordance with the invention, a second insulating layer which is thinner than the first insulating layer has a second contact window, which is smaller than the first contact window, whereby the second insulating layer covers the edge of the surface of the semiconductor body, which extends through the contact window and contact metal is provided in the first and in the second contact window.

The second insulating layer is preferably sufficiently thick that, following its production, it will not be destroyed by subsequent technology steps, such as the application of the contact metal. It should further be sufficiently thick that when voltage is applied to the diode, its breakdown field intensity will not be exceeded. A voltage of 160 volts, for example, requires a layer thickness for the second insulating layer of approximately 200 A, when the contact metal is aluminum, the semiconductor is silicon of 1.8 Ω cm resistivity and the second insulating layer is silicon nitride.

The breakdown voltage of the diodes, according to the invention, are essentially higher than those of the diodes which are provided with a diffused protective ring. Since minority carriers are virtually not existent, the diode has a very short switching period. No diffusion furnaces are required for its production. This permits simple manufacture from the technological viewpoint.

The diode, according to the invention, can be so produced, for example, that a first window is etched, to start with, into the first, thicker insulating layer. The second insulating layer is then applied in total area, over the first insulating layer, as well, whereupon a second window is etched into the second insulating layer. The second window is about 10 to 30 μm smaller in its diameter than the first window. Finally the metal contact is installed into the first window, via the second insulating layer.

The semiconductor body may also consist of silicon, germanium, gallium arsenide or other suitable materials.

In accordance with another feature of the invention, the second insulating layer comprises at least two insulating films. Suitable materials for these films are, for instance, silicon dioxide and silicon nitride.

Other features and details of the invention are derived from the following disclosure of an embodiment example, with reference to the drawing, the single FIGURE of which shows a metal semiconductor diode in section.

Arranged on a semiconductor substrate 1 of $10^{-2}\Omega$ cm resistivity, is an epitactic layer 2 with a 1.0 Ω cm resistivity. The semiconductor substrate 1 and the epitactic layer 2, form a semiconductor body. Situated on the epitactic layer 2 is a first insulating layer 3 consisting of thermal silicon dioxide, and containing a first circular window 5. The first insulating layer 3 is covered by a second insulating layer 4 which comprises pyrolytic silicon nitride. The second insulating layer 4 also overlaps the edges of the window 5, on the surface of the epitactic layer 2, so that a circular window 6, whose diameter is 10 to 30 μm smaller than the diameter of the first window, remains exposed for the contact metal 7. Aluminum or an alloy of aluminum and nickel is suitable as the contact metal. However, other materials such as platinum silicide, for example, may be used as contact metals.

The layer thickness of the first insulating layer 3 amounts to 0.6 μm and the layer thickness of the second insulating layer 4 is about 200 A.

The second insulating layer may comprise a sequence of two films. In a semiconductor body of silicon of n-conductivity type with a resistivity of 0.6 Ω cm, the first film for a breakdown voltage of 60 volts, consists, e.g. of thermal silicon dioxide with a layer thickness of 50 A, and the second film comprises pyrolytic silicon nitride with a layer thickness of 110 A. In a semiconductor body of silicon of n-conductivity type, with a resistivity of 5.0 Ω cm, for a breakdown voltage of 200 volts, the first film is 150 A thick and comprises silicon dioxide, while the second film is 400 A thick and consists of pyrolytic silicon nitride.

By constructing the second insulating layer with the aid of two or even more films, it is insured the creep currents are very small and that the recombination of the charge carriers, via traps, is prevented.

The abbreviation "μm" stands for micrometer and is the equivalent of micron.

I claim:

1. A metal semiconductor diode with a silicon dioxide insulating layer, arranged on a semiconductor body and provided with a first contact window, a silicon nitride insulating layer which is thinner than the silicon dioxide insulating layer on said silicon dioxide insulating layer, said silicon nitride insulating layer having therein a second contact window which is 10 to 30 μm smaller than the first contact window, so that said silicon nitride insulating layer covers the edge of the surface of the semiconductor body which emerges through the first contact window and contact metal is provided in the first and in the second contact windows, said silicon dioxide layer being 0.4 to 0.8 μm thick and said silicon nitride layer being 100 – 500 A thick.

2. The diode of claim 1, wherein the silicon nitride layer is 200 A thick.

* * * * *